US012568579B2

(12) United States Patent
Wang et al.

(10) Patent No.:  US 12,568,579 B2
(45) Date of Patent:  Mar. 3, 2026

(54) TEMPERATURE SENSOR FOR AN INVERTER FOR OPERATING AN ELECTRIC DRIVE IN AN ELECTRIC VEHICLE OR HYBRID VEHICLE, INVERTER WITH SUCH A TEMPERATURE SENSOR

(71) Applicant: ZF Friedrichshafen AG, Friedrichshafen (DE)

(72) Inventors: Pengshuai Wang, Eriskirch (DE); Michael Kohr, Bodnegg (DE); Philipp Rau, Friedrichshafen (DE); Hans-Joerg Hahn, Heilbronn (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 481 days.

(21) Appl. No.: 18/164,445

(22) Filed: Feb. 3, 2023

(65) Prior Publication Data

US 2023/0254976 A1      Aug. 10, 2023

(30) Foreign Application Priority Data

Feb. 4, 2022    (DE) ..................... 10 2022 201 176.7

(51) Int. Cl.
*H05K 1/14*           (2006.01)
*G01K 1/14*           (2021.01)
          (Continued)

(52) U.S. Cl.
CPC .............. *H05K 1/141* (2013.01); *G01K 1/14* (2013.01); *G01K 7/16* (2013.01); *H01R 12/585* (2013.01); *H05K 7/1432* (2013.01)

(58) Field of Classification Search
CPC ........ H05K 1/141; H05K 7/1432; G01K 1/14; G01K 7/16; G01K 7/22; G01K 13/00; H01R 12/585; H02M 7/003
See application file for complete search history.

(56) References Cited

U.S. PATENT DOCUMENTS 5,046,857 A *  9/1991  Metzger ................... G01K 7/16
                                                      374/185
2002/0071475 A1*  6/2002  Betzner ................... G01K 7/22
                                                      374/185
(Continued)

FOREIGN PATENT DOCUMENTS

DE       10 2013 212 940 A1     12/2014
DE       10 2019 208 076 A1     12/2020

OTHER PUBLICATIONS

Office Acton issued in corresponding German Patent Application DE 10 2022 201 176.7, dated Oct. 12, 2022 (8 pages).

*Primary Examiner* — Jacob R Crum

(74) *Attorney, Agent, or Firm* — Crowell & Moring LLP

(57) ABSTRACT

A temperature sensor for an inverter for operating an electric drive in an electric vehicle or hybrid vehicle includes at least one rod-shaped signal connector, a mount, and a sensor printed circuit board, wherein at least one groove is formed in the mount for the at least one rod-shaped signal connector, wherein the at least one rod-shaped signal connector has an insertion part that is inserted in a printed circuit board in the inverter, wherein the insertion part extends beyond an upper edge of the mount facing the printed circuit board, wherein the at least one rod-shaped signal connector extends at the bottom beyond a lower edge of the mount facing away from the printed circuit board, wherein a sensor element for temperature detection is placed on an end of the sensor printed circuit board facing away from the printed circuit board.

17 Claims, 5 Drawing Sheets

(51) Int. Cl.
   *G01K 7/16*        (2006.01)
   *H01R 12/58*       (2011.01)
   *H05K 7/14*        (2006.01)

(56)                References Cited

U.S. PATENT DOCUMENTS

| 2007/0222046 A1* | 9/2007 | Tokunaga | H01L 23/34 |
| | | | 257/E23.08 |
| 2009/0052210 A1* | 2/2009 | Ward | G05D 23/20 |
| | | | 374/152 |
| 2011/0075451 A1* | 3/2011 | Bayerer | H01L 24/85 |
| | | | 257/692 |
| 2014/0029220 A1 | 1/2014 | Braun et al. | |
| 2020/0112111 A1 | 4/2020 | Truessel et al. | |

* cited by examiner 164          16

166

164

168

164

TEMPERATURE SENSOR FOR AN INVERTER FOR OPERATING AN ELECTRIC DRIVE IN AN ELECTRIC VEHICLE OR HYBRID VEHICLE, INVERTER WITH SUCH A TEMPERATURE SENSOR

CROSS-REFERENCE TO RELATED APPLICATION

This application claims priority to German Application No. DE 10 2022 201 176.7, filed on Feb. 4, 2022, the entirety of which is hereby fully incorporated by reference herein.

TECHNICAL FIELD

The present disclosure relates to a temperature sensor built into an inverter for operating an electric drive in an electric vehicle or hybrid vehicle, and a corresponding inverter.

BACKGROUND

There are purely electric vehicles and hybrid vehicles in the prior art that are powered exclusively or partially by one or more electric machines functioning as the drive assembly. To supply the electric machines in these electric or hybrid vehicles with electricity, the electric and hybrid vehicles contain electric energy storage units, in particular rechargeable batteries. These batteries are DC power sources, while the electric machines normally require AC power. For this reason, a power electronics unit with a so-called inverter is normally interconnected between the battery and the electric machine in an electric or hybrid vehicle.

These inverters normally comprise semiconductor switches, typically in the form of transistors. The semiconductor switches can be of different orders of integration, specifically as either discrete individual switches with a low order of integration but high scalability, as a power module with a high order of integration but a lower scalability, or as half bridges with orders of integration and scalability ranging between individual switches and half bridges. Each half bridge comprises a high-side switching setting (hereinafter, "high-side") with a high electrical potential and a low-side switching setting (hereinafter, "low-side") with a lower electrical potential. The high-side and low-side can each comprise one or more individual or semiconductor switches that are connected in parallel.

There are numerous power connections in each half bridge, by means of which DC inputs are fed into the semiconductor switches and AC output can be obtained from the semiconductor switches. There are also numerous signal connectors for control signal transfer in each half bridge, in particular gate signals, by means of which the semiconductor switches can be switched in a targeted manner, in order to allow or prevent the passage of a load current through the respective semiconductor switch. In this manner, a current flow between the individual power connections is enabled or prevented. A control electronics unit comprising a printed circuit board populated with numerous electronic components generates the control signals.

The semiconductor switches must not exceed their maximum operating temperatures during operation. To ensure this, temperature sensors have been used with the inverters in the prior art, in order to be able to detect the approximate temperatures in the semiconductor switches. The installation of these temperature sensors can also be difficult, depending on the design. Moreover, these temperature sensors require a comparatively large installation space, in order to accommodate additional components for securing the temperature sensors during installation.

SUMMARY

One object of the present disclosure is to create a temperature sensor for an inverter for operating an electric drive in an electric or hybrid vehicle with which the disadvantages specified above are at least partially resolved.

This object is achieved by the temperature sensor and the inverter according to the present disclosure. Advantageous embodiments and developments can also be derived from the present disclosure.

The present disclosure relates to a temperature sensor that is built into an inverter for an electric drive in an electric or hybrid vehicle.

The temperature sensor comprises at least one rod-shaped signal connector, preferably two or more rod-shaped signal connectors. The rod-shaped signal connectors can have a circular or rectangular cross section, or some other cross section. The temperature sensor comprises a mount, preferably made of plastic. The mount preferably has a groove for each of the rod-shaped signal connectors. The grooves can preferably accommodate the rod-shaped signal connectors in a form-fitting and/or force-fitting manner.

Each of the rod-shaped signal connectors has an insertion part that is inserted into a printed circuit board in the inverter. The printed circuit board has one or more holes for this, for a force-fitting and/or form-fitting accommodation of the insertion parts. The insertion parts extend beyond an upper edge of the mount facing the printed circuit board and can be inserted in the corresponding holes in the printed circuit board. The at least one rod-shaped signal connector extends at the lower end beyond a lower edge of the mount, facing away from the printed circuit board and opposite the upper edge. Preferably numerous, or all, of the rod-shaped signal connectors extend beyond the lower edge of the mount. A sensor element for temperature detection is attached to an end of the sensor printed circuit board facing away from the printed circuit board. The sensor element can be formed by a material with a negative temperature coefficient (NTC) or a positive temperature coefficient (PTC).

As a result, pressure can be applied to the temperature sensor particularly easily from below, toward the printed circuit board, when it is inserted in the printed circuit board, without affecting the structure of the temperature sensor. In particular, the respective insertion parts on the temperature sensor can be inserted into the printed circuit board with a comparatively high pressure, such that the temperature sensor is securely attached to the printed circuit board. Furthermore, additional securing elements for securing the temperature sensor while inserting it in the printed circuit board are unnecessary, thus reducing the necessary installation space.

According to one embodiment, the sensor printed circuit board is placed between two longitudinal walls of the mount, the spacing between which substantially corresponds to the width of the sensor printed circuit board. The sensor printed circuit board therefore forms a lid that closes a gap between the longitudinal walls, such that the at least one rod-shaped signal connector is located between the mount and the lid (or sensor printed circuit board). Because the spacing between the longitudinal walls corresponds to the width of the sensor printed circuit board, rotation of the sensor printed circuit board in relation to the mount is reduced or even entirely prevented when it is placed therein. As a result, the sensor printed circuit board is securely accommodated in the mount.

According to another embodiment, the mount contains a centering element that extends from a contact surface lying against the sensor printed circuit board when it is placed therein, into a receiver formed in the sensor printed circuit board. The centering element can have a round or rectangular cross section in the direction parallel to the sensor printed circuit board. This reduces or even prevents a displacement and/or rotation of the sensor printed circuit board in relation to the mount. The receiver formed in the sensor printed circuit board can form a blind hole or a through hole.

According to another embodiment, the mount is an injection molded part formed by coating the at least one rod-shaped signal connector. The temperature sensor can be produced more easily in this manner. Furthermore, the adhesion between the mount and the at least one rod-shaped signal connector is particularly robust. Alternatively, the mount is a prefabricated component, in which the at least one rod-shaped signal connector is secured by inserting it into the groove on the mount.

According to another embodiment, the end of the sensor printed circuit board facing away from the printed circuit board is connected to a heat sink or a sealing compound for the inverter. The end of the sensor printed circuit board facing away from the printed circuit board preferably penetrates a surface of the heat sink, an intermediate element that is thermally coupled to the heat sink (by means of an additional heat conductor), or the sealing compound, lying opposite the printed circuit board, such that the sensor element is accommodated in the heat sink or sealing compound. In this manner, the sensor element is located in the vicinity of the semiconductor switch when the temperature sensor is installed, such that the operating temperature of the semiconductor switch can be detected more accurately. Alternatively, the end of the sensor printed circuit board pacing away from the printed circuit board is connected to a surface of the heat sink, or the sealing compound, lying opposite the printed circuit board, such that the sensor element is located outside the heat sink or the sealing compound.

The present disclosure also relates to an inverter for an electric drive in an electric vehicle or hybrid vehicle, which has a temperature sensor according to the present disclosure. This also results in the advantages already described in conjunction with the half bridge according to the present disclosure for the inverter according to the present disclosure.

The inverter comprises numerous semiconductor switches, a substrate, a heat sink, and a printed circuit board. The substrate is preferably a multi-layered substrate, such as a Direct Bonded Copper (DBC) substrate, which has a first metal layer, a second metal layer, and an insulating layer therebetween. The semiconductor switches are placed on the substrate, preferably on the first metal layer. The substrate is connected to the heat sink in order to cool the semiconductor switches. The second metal layer is preferably attached to an upper surface of the heat sink. The printed circuit board is populated with electronic components for activating the semiconductor switches, and the temperature sensor is attached to the printed circuit board.

The present disclosure shall be explained in detail below in reference to the exemplary embodiments shown in the drawings.

DETAILED DESCRIPTION

The same objects, functional units, and comparable component have the same reference symbols in all of the drawings. These objects, functional units, and comparable components are identical with respect to their technical features, as long as not otherwise explicitly or implicitly indicated in the description.

Figure 1:
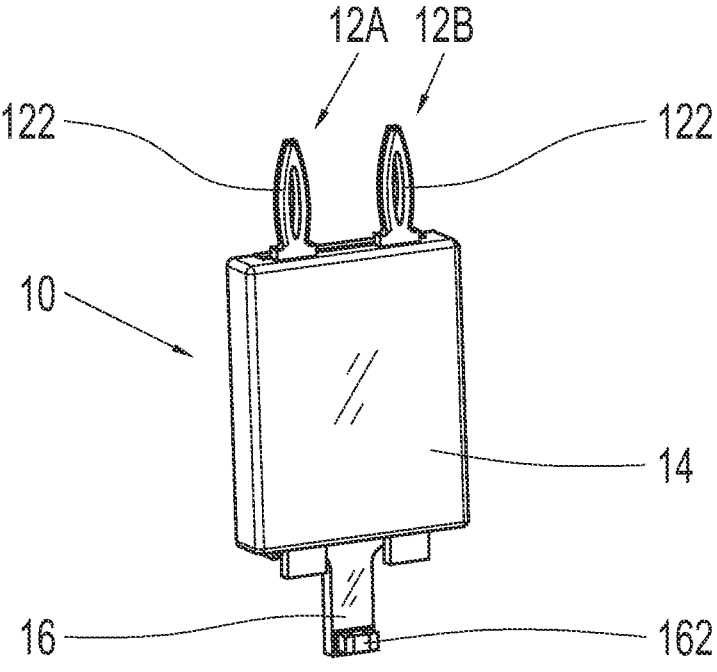
FIG. 1 shows a schematic illustration of a temperature sensor according to various embodiments.
Figure 2:
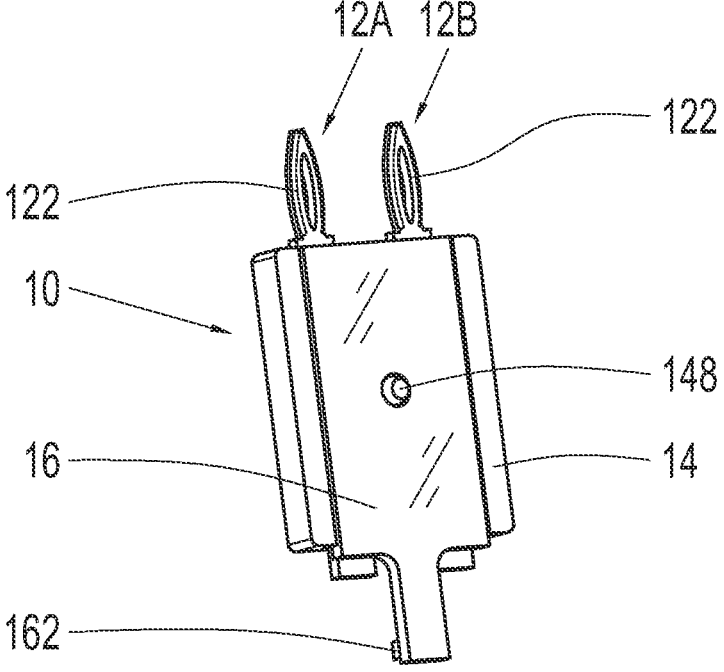
FIG. 2 shows another schematic illustration of the temperature sensor in FIG. 1.
Figure 3:
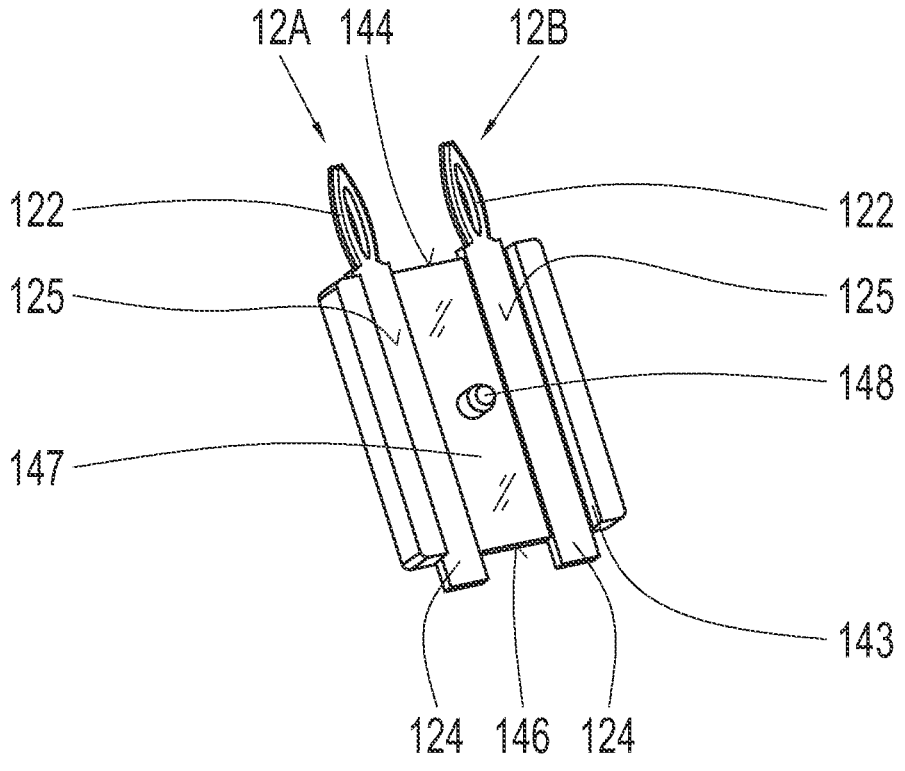
FIG. 3 shows an illustration of a mount for the temperature sensor in FIG. 1, in which two rod-shaped signal connectors are placed in the mount.
Figure 4:
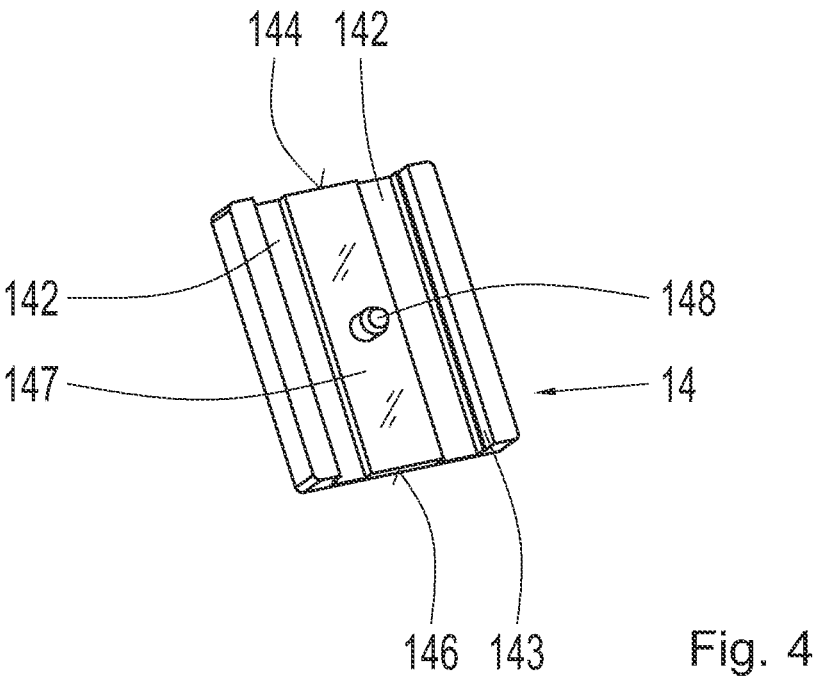
FIG. 4 shows a schematic illustration of the mount in FIG. 3.
Figure 5:
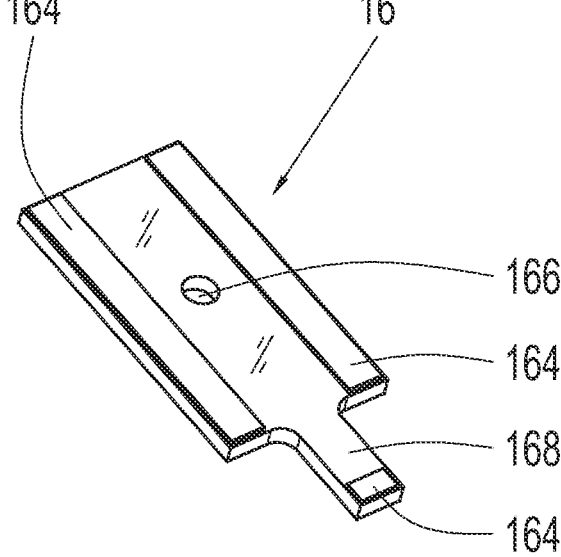
FIG. 5 shows a schematic illustration of a sensor printed circuit board for the temperature sensor in FIG. 1.

FIGS. 1-2 show schematic illustrations of a temperature sensor 10 for an inverter (DC/AC inverter), which is used for providing an electric drive in an electric vehicle and/or hybrid vehicle with electricity. The temperature sensor 10 has numerous parts and comprises at least one rod-shaped signal connector 12 (see FIGS. 7-8), in this case two rod-shaped signal connectors 12A, 12B, a mount 14, and a sensor printed circuit board 16. The mount 14 is flat, and has two longitudinal grooves 142, as shown in greater detail in FIG. 4, which are parallel to one another. The grooves 142 preferably extend over the entire length of the mount 14, as shown schematically in FIG. 4. The two rod-shaped signal connectors 12A, 12B are placed in a form-fitting manner in the grooves 142, and each have an insertion part 122 and foot part 124. The insertion part extends beyond an upper edge 144 of the mount 14. The foot part 124 extends beyond a lower edge 146 of the mount 14. FIG. 3 shows a schematic illustration of the mount 14 in which the rod-shaped signal connectors 12A, 12B are placed in the mount 14 and secured therein. The mount 14 also has a centering element 148, which is substantially in the middle of an inner surface 147 of the mount 14, and protrudes therefrom. The sensor printed circuit board 16 forms a lid between two lateral longitudinal walls 143 of the mount 14. The sensor printed circuit board 16 has two longitudinal connecting strips 164, as shown schematically in FIG. 5, which can each be connected to a front surface 125 of the respective rod-shaped signal connectors 12A, 12B facing away from the grooves 142. When the sensor printed circuit board 16 is installed, the centering element 148 passes through a hole 166 formed in the middle of the sensor printed circuit board 16. The width of the sensor printed circuit board 16 substantially corresponds to the distance between the two lateral longitudinal walls 142 on the mount 14. This reduces or even prevents rotational and linear movement of the sensor printed circuit board 16 in relation to the mount 14, such that the sensor printed circuit board 16 is held in place in a particularly secure and robust manner on the mount 14.

A sensor unit 162 for detecting a temperature is placed in an end section 168, preferably a lower edge, of the sensor printed circuit board 16. This is an NTC or PTC temperature sensor element. To detect a temperature as accurately as possible, the temperature sensor 10 is placed in an inverter 50 between a printed circuit board 18 and a heat sink 20 (or an intermediate element thermally coupled thereto), or a sealing compound 22, as shown schematically in the embodiments shown in FIGS. 6-8, such that the sensor element 162 is as close as possible to the semiconductor switches in the inverter.

The inverter 50 comprises numerous semiconductor switches (not shown), a substrate (not shown), a heat sink 20, and a printed circuit board 18. For purposes of simplicity, only a heat sink 20, or sealing compound 22 with which the substrate and the semiconductor elements are coated in an injection molding process, is shown schematically in FIGS. 6-8. The semiconductor switches are placed on the substrate, which is connected to the heat sink 20 for the purpose of cooling the semiconductor switches. The printed circuit board 18 is populated with electronic components for activating the semiconductor switches.

Figures 6, 7:
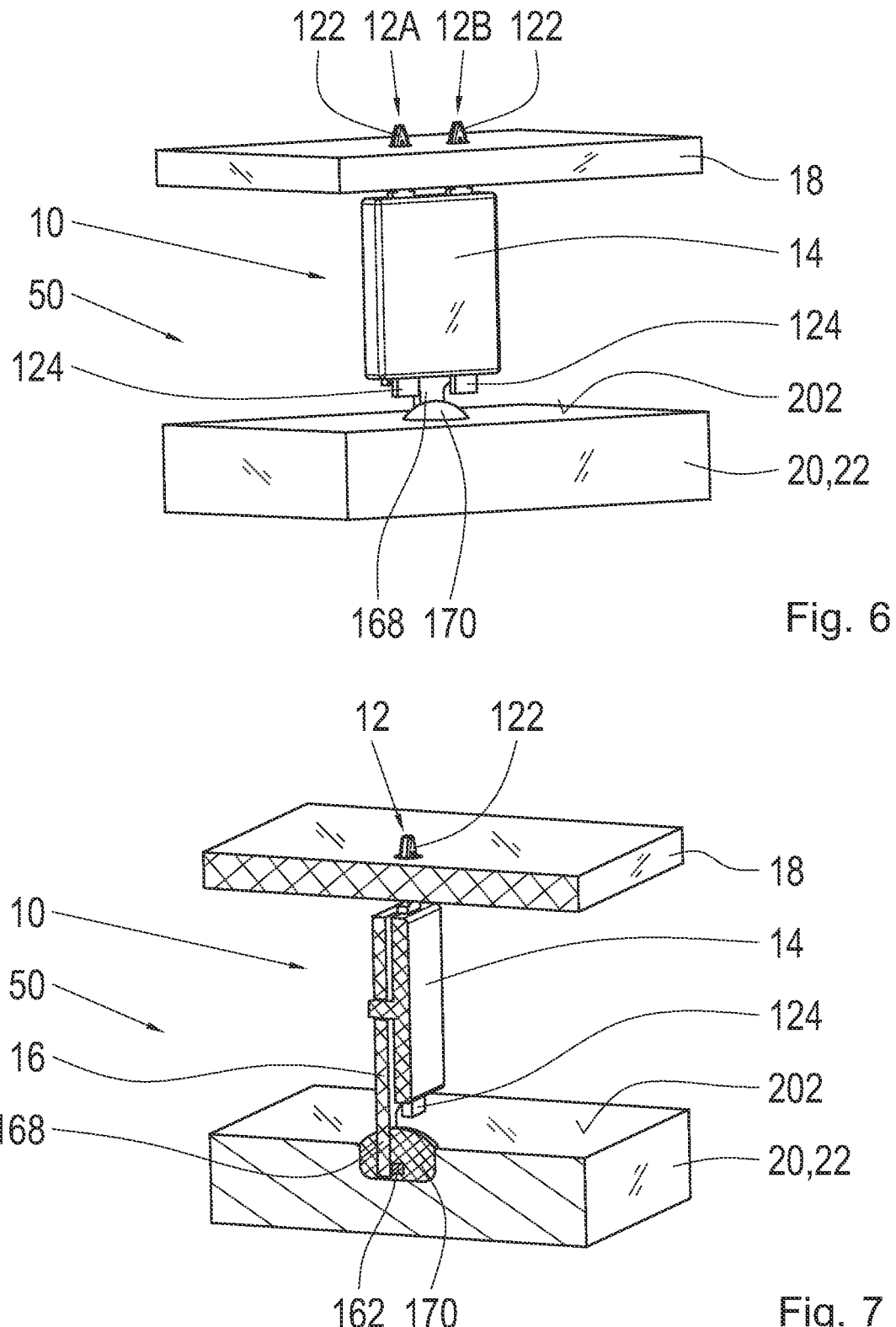
FIG. 6 shows a schematic illustration of the temperature sensor in FIG. 1, which is placed between a printed circuit board and a heat sink for an inverter.
FIG. 7 shows another schematic illustration of the temperature sensor in FIG. 6, in which the temperature sensor penetrates the heat sink from below.

In the embodiment schematically illustrated in FIG. 6, the insertion parts 122 of the rod-shaped signal connectors 12A, 12B are inserted into two dedicated insertion holes formed in the printed circuit board 18 in order to install the temperature sensor 10 in the inverter 50. The insertion parts 122 have bowed edges formed by connecting the two forked ends, resulting in a hole therebetween. When inserted into the holes in the printed circuit board 18, the bowed edges of the insertion parts are compressed and tensioned slightly, such that the insertion parts 122 press securely against the inner walls of the insertion holes and are thus secured in the printed circuit board 18 as a result of the tension. The end section 168 of the sensor printed circuit board 16 is partially within the heat sink 20 or intermediate element, or sealing compound 22, at the lower end of the temperature sensor 10. A connecting means 170, which is preferably a sealing means or heat conductor, is used to secure the lower end section 168 of the sensor printed circuit board 16 in place.

FIG. 7 shows a schematic illustration of an embodiment in which the temperature sensor 10 has only one rod-shaped signal connector 12. As in the embodiment shown in FIG. 6, the rod-shaped signal connector 12 is first inserted at the upper insertion part 122 into the insertion hole in the printed circuit board 18. The end section 168 of the sensor printed circuit board 18 is then placed inside the heat sink 20/intermediate element, or the sealing compound 22, in that a recess is formed on a surface 202 of the heat sink 20, or sealing compound 22, lying opposite the printed circuit board, such that the end section 168 can be placed along with the sensor element 162 in the recess. When placed therein, the recess is filled with the connecting or sealing means, e.g. a lubricant or plastic.

Figure 8:
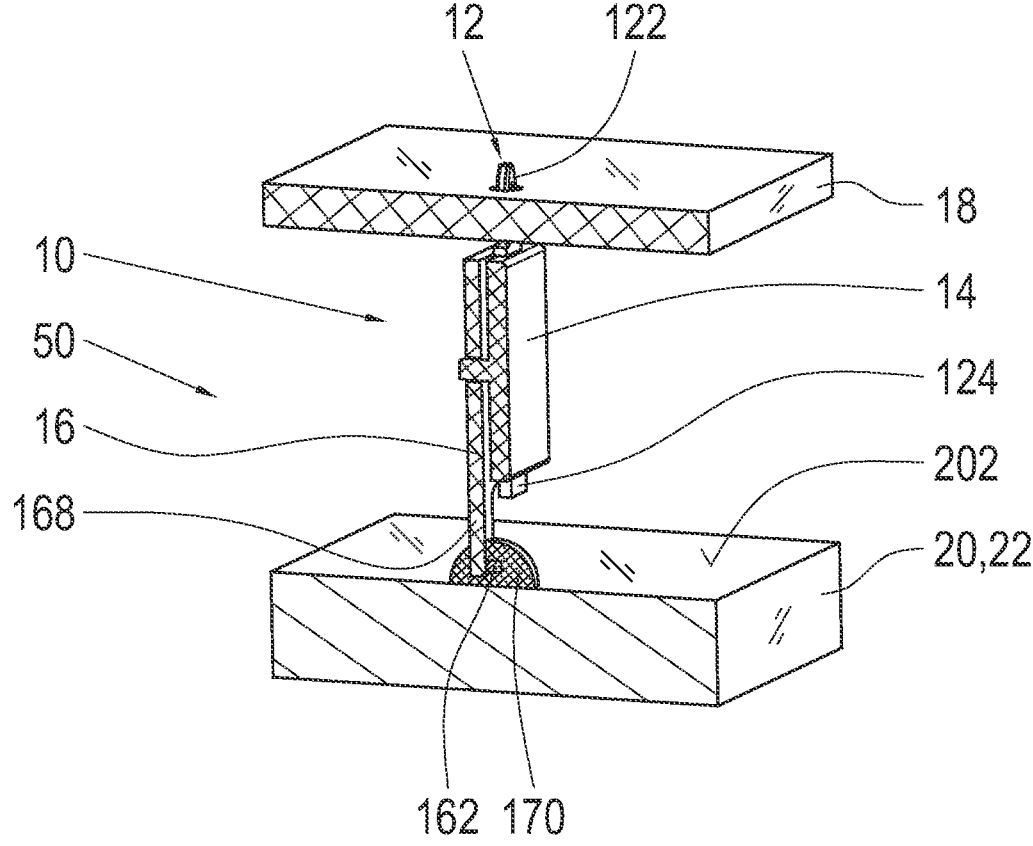
FIG. 8 shows another schematic illustration of the temperature sensor in FIG. 6, in which the temperature sensor is attached to the lower surface of the heat sink.

In the embodiment shown in FIG. 8, in which the temperature sensor 10 also has only one rod-shaped signal connector 12, by way of example, the rod-shaped signal connector 12 is first inserted with its upper insertion part 122 into the insertion hole in the printed circuit board 12, just like in the embodiment shown in FIG. 6. The end section 168 of the sensor printed circuit board 18 is then connected to the surface 202 of the heat sink/intermediate element, or the sealing compound 22, using the connecting or sealing means.

REFERENCE SYMBOLS

10 temperature sensor
12, 12A, B rod-shaped signal connector
122 insertion part
124 foot part
125 front surface
14 mount
142 groove
143 longitudinal wall
144 upper edge
146 lower edge
147 inner surface
148 centering element
16 sensor printed circuit board
162 sensor element
164 connecting means
166 hole
168 end section
170 connecting means
18 printed circuit board
20 heat sink
202 surface
22 sealing compound
The invention claimed is:

1. A temperature sensor for an inverter for operating an electric drive in a vehicle, comprising:
   at least one rod-shaped signal connector;
   a mount; and
   a sensor printed circuit board,
   wherein at least one groove is formed in the mount for the at least one rod-shaped signal connector,
   wherein the at least one rod-shaped signal connector has an insertion part that is inserted in an inverter printed circuit board in the inverter,
   wherein the insertion part extends beyond an upper edge of the mount facing the inverter printed circuit board,
   wherein the at least one rod-shaped signal connector extends at the bottom beyond a lower edge of the mount facing away from the inverter printed circuit board,
   wherein a sensor element for temperature detection is placed on an end of the sensor printed circuit board facing away from the inverter printed circuit board,
   wherein the sensor printed circuit board is placed between two longitudinal walls of the mount, and
   wherein a distance between the longitudinal walls substantially corresponds to a width of the sensor printed circuit board.

2. The temperature sensor according to claim 1, wherein the mount contains a centering element that extends from a contact surface that comes in contact with the sensor printed circuit board when it is placed therein, into a receiver formed in the sensor printed circuit board.

3. The temperature sensor according to claim 1, wherein the end of the sensor printed circuit board facing away from the inverter printed circuit board is connected to a heat sink, an intermediate element thermally coupled to the heat sink, or a sealing compound for the inverter.

4. The temperature sensor according to claim 1, wherein the mount contains a centering element that extends from a contact surface that comes in contact with the sensor printed circuit board when it is placed therein, into a receiver formed in the sensor printed circuit board.

5. The temperature sensor according to claim 4, wherein the receiver contains a blind hole or through hole.

6. The temperature sensor according to claim 4, wherein the end of the sensor printed circuit board facing away from the inverter printed circuit board is connected to a heat sink, an intermediate element thermally coupled to the heat sink, or a sealing compound for the inverter.

7. The temperature sensor according to claim 1, wherein the mount is an injection molded part formed by coating the at least one signal connector.

8. The temperature sensor according to claim 1, wherein the mount is a prefabricated component.

9. The temperature sensor according to claim 1, wherein the at least one rod-shaped signal connector is held in place by inserting the at least one rod-shaped signal connector into the groove on the mount.

10. The temperature sensor according to claim 1, wherein the end of the sensor printed circuit board facing away from the inverter printed circuit board is connected to a heat sink, an intermediate element thermally coupled to the heat sink, or a sealing compound for the inverter.

11. The temperature sensor according to claim 10, wherein the end of the sensor printed circuit board facing away from the inverter printed circuit board penetrates a surface of the heat sink, the intermediate element, or the sealing compound lying opposite the inverter printed circuit board such that the sensor element is accommodated in the heat sink or the sealing compound.

12. The temperature sensor according to claim 10, wherein the end of the sensor printed circuit board facing away from the inverter printed circuit board is connected to a surface of the heat sink, intermediate element, or sealing compound lying opposite the inverter printed circuit board such that the sensor element is located outside the heat sink or sealing compound.

13. A device comprising:
the temperature sensor according to claim 1; and
an inverter comprising:
  a plurality of semiconductor switches;
  a substrate;
  a heat sink; and
  the inverter printed circuit board,
  wherein the semiconductor switches are placed on the substrate,
  wherein the substrate is connected to the heat sink or an intermediate element thermally coupled to the heat sink for the purpose of cooling the semiconductor switches,
  wherein the inverter printed circuit board is populated with electronic components for activating the semiconductor switches, and
  wherein the temperature sensor is attached to the inverter printed circuit board.

14. A temperature sensor for an inverter for operating an electric drive in a vehicle, comprising:
at least one rod-shaped signal connector;
a mount; and
a sensor printed circuit board,
wherein at least one groove is formed in the mount for the at least one rod-shaped signal connector, wherein the at least one rod-shaped signal connector has an insertion part that is inserted in an inverter printed circuit board in the inverter,
wherein the insertion part extends beyond an upper edge of the mount facing the inverter printed circuit board,
wherein the at least one rod-shaped signal connector extends at the bottom beyond a lower edge of the mount facing away from the inverter printed circuit board,
wherein a sensor element for temperature detection is placed on an end of the sensor printed circuit board facing away from the inverter printed circuit board, and
wherein the mount contains a centering element that extends from a contact surface that comes in contact with the sensor printed circuit board when it is placed therein, into a receiver formed in the sensor printed circuit board.

15. The temperature sensor according to claim 14, wherein the receiver contains a blind hole or through hole.

16. The temperature sensor according to claim 14, wherein the end of the sensor printed circuit board facing away from the inverter printed circuit board is connected to a heat sink, an intermediate element thermally coupled to the heat sink, or a sealing compound for the inverter.

17. A device comprising:
an inverter for operating an electric drive in a vehicle, the inverter comprising:
  a plurality of semiconductor switches;
  a substrate;
  a heat sink; and
  an inverter printed circuit board,
  wherein the semiconductor switches are placed on the substrate,
  wherein the substrate is connected to the heat sink or an intermediate element thermally coupled to the heat sink for the purpose of cooling the semiconductor switches, and
  wherein the inverter printed circuit board is populated with electronic components for activating the semiconductor switches, and
a temperature sensor for the inverter comprising:
  at least one rod-shaped signal connector;
  a mount; and
  a sensor printed circuit board,
  wherein at least one groove is formed in the mount for the at least one rod-shaped signal connector,
  wherein the at least one rod-shaped signal connector has an insertion part that is inserted in the inverter printed circuit board in the inverter,
  wherein the insertion part extends beyond an upper edge of the mount facing the inverter printed circuit board,
  wherein the at least one rod-shaped signal connector extends at the bottom beyond a lower edge of the mount facing away from the inverter printed circuit board,
  wherein a sensor element for temperature detection is placed on an end of the sensor printed circuit board facing away from the inverter printed circuit board, and
  wherein the temperature sensor is attached to the inverter printed circuit board.

* * * * *